US011687173B2

(12) United States Patent
Kadowaki et al.

(10) Patent No.: US 11,687,173 B2
(45) Date of Patent: Jun. 27, 2023

(54) SENSOR FOR DETECTING PEN SIGNAL TRANSMITTED FROM PEN

(71) Applicant: Wacom Co., Ltd., Saitama (JP)

(72) Inventors: Jun Kadowaki, Saitama (JP); Yutaka Kamioka, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 17/581,634

(22) Filed: Jan. 21, 2022

(65) Prior Publication Data

US 2022/0147166 A1    May 12, 2022

Related U.S. Application Data

(63) Continuation of application No. 16/691,402, filed on Nov. 21, 2019, now Pat. No. 11,249,564, which is a
(Continued)

(30) Foreign Application Priority Data

Aug. 1, 2017   (JP) ................................ 2017-149055

(51) Int. Cl.
*G06F 3/0354* (2013.01)
*G06F 3/044* (2006.01)
(Continued)

(52) U.S. Cl.
CPC ........ *G06F 3/03545* (2013.01); *G06F 3/0442* (2019.05); *G06F 3/0445* (2019.05);
(Continued)

(58) Field of Classification Search
CPC combination set(s) only.
See application file for complete search history.

(56) References Cited

U.S. PATENT DOCUMENTS

| 5,952,999 A | 9/1999 | Makinwa |
| 8,736,565 B2 * | 5/2014 | Kim ..................... G06F 3/0446 |
| | | 345/173 |

(Continued)

FOREIGN PATENT DOCUMENTS

| DE | 697 29 704 T2 | 7/2005 |
| JP | H08-137607 A | 5/1996 |

(Continued)

OTHER PUBLICATIONS

International Search Report, dated Oct. 9, 2018, for International Application No. PCT/JP2018/027326, 4 pages.

*Primary Examiner* — William Boddie
*Assistant Examiner* — Alecia D English
(74) *Attorney, Agent, or Firm* — Seed IP Law Group LLP

(57) ABSTRACT

A sensor is provided for detecting a pen signal transmitted from a pen. The sensor includes a touch sensor, flexible printed circuit (FPC) connector terminals, and a detection pattern. The touch sensor has linear electrodes, which form a position detection area and are configured to respectively detect the pen signal. The FPC connector terminals are connected to the linear electrodes, respectively, via routing traces arranged outside the position detection area. The detection pattern is arranged in a region outside the position detection area, near the FPC connector terminals, and is configured to detect the pen signal.

14 Claims, 16 Drawing Sheets

Related U.S. Application Data continuation of application No. PCT/JP2018/027326, filed on Jul. 20, 2018.

(51) Int. Cl.
  *H05K 1/18* (2006.01)
  *G06F 3/041* (2006.01)

(52) U.S. Cl.
  CPC ........ *G06F 3/0446* (2019.05); *G06F 3/04164* (2019.05); *G06F 2203/04102* (2013.01); *G06F 2203/04112* (2013.01); *H05K 1/189* (2013.01)

(56) References Cited

U.S. PATENT DOCUMENTS

| | | | |
|---|---|---|---|
| 10,042,477 B2 | 8/2018 | King-Smith et al. | |
| 2005/0285542 A1* | 12/2005 | Wakabayashi | H01L 27/3276 315/169.3 |
| 2008/0129317 A1 | 6/2008 | Oba | |
| 2010/0053092 A1 | 3/2010 | Chen et al. | |
| 2011/0181545 A1 | 7/2011 | Takahashi et al. | |
| 2013/0234986 A1* | 9/2013 | Elias | G06F 3/03545 345/174 |
| 2014/0062898 A1 | 3/2014 | Singh et al. | |
| 2014/0078101 A1 | 3/2014 | Katsurahira | |
| 2015/0194109 A1 | 7/2015 | Fujikawa | |
| 2016/0062519 A1* | 3/2016 | Park | G06F 3/0446 345/173 |
| 2016/0062527 A1 | 3/2016 | Lee | |
| 2016/0216738 A1* | 7/2016 | Fukuma | G06F 1/1652 |
| 2017/0097529 A1 | 4/2017 | Kubota et al. | |
| 2017/0139516 A1* | 5/2017 | Koike | B32B 27/281 |
| 2017/0177120 A1 | 6/2017 | Kyutoku et al. | |
| 2018/0018029 A1 | 1/2018 | Lim et al. | |
| 2018/0060608 A1* | 3/2018 | Holden | H04W 12/069 |
| 2018/0088701 A1* | 3/2018 | Seok | G06F 3/0445 |
| 2018/0239476 A1 | 8/2018 | Yoshida et al. | |

FOREIGN PATENT DOCUMENTS

| | | |
|---|---|---|
| JP | 2008-152640 A | 7/2008 |
| JP | 2010-086542 A | 4/2010 |
| JP | 2013-143048 A | 7/2013 |
| JP | 2014-063249 A | 4/2014 |
| WO | 2012/057888 | 5/2012 |

* cited by examiner

SENSOR FOR DETECTING PEN SIGNAL TRANSMITTED FROM PEN

BACKGROUND

1. Technical Field

The present disclosure relates to a sensor for detecting a pen signal transmitted from a pen, and especially to a sensor having a touch sensor superimposed over a display panel.

2. Description of the Related Art

In a tablet electronic device having a function to detect the position of a finger or a stylus, a touch sensor is arranged over a display panel. The touch sensor is configured having linear electrodes that include X-electrodes and Y-electrodes. The X-electrodes each extend in a Y-direction, and are arranged at equal intervals in an X-direction, while the Y-electrodes each extend in the X-direction, and are arranged at equal intervals in the Y-direction. In a bezel area of the display panel, flexible printed circuit (FPC) connector terminals and routing traces are disposed to correspond to the respective linear electrodes, and the respective linear electrodes and the FPC connector terminals are electrically connected via the routing traces, respectively. The individual FPC connector terminals are connected to terminals on a flexible printed circuit board by pressure bonding, and are connected to a sensor controller via routing traces on the flexible printed circuit board. In the present disclosure, an input device formed of such touch sensor and sensor controller is called "sensor."

As a type of stylus, an active stylus is known. An active stylus includes a power supply unit and a signal processing circuit, and is configured to enable transmission of a pen signal by supplying an electric charge, which corresponds to a signal generated by the signal processing circuit, to an electrode (pen electrode) disposed near a pen tip. The term "stylus" as used hereinafter means "active stylus" unless otherwise specifically indicated. A pen signal includes a position signal and data signals. The position signal is a burst signal for informing the pen's position. The data signals include various data such as writing pressure data indicating the value of a writing pressure detected by the stylus, data indicating on/off state of an operation button disposed on a side wall or end wall of the stylus, and a unique identifier (ID) written beforehand in the stylus. In detecting the stylus, a pen signal is received at some of the linear electrodes in the touch sensor, which are located near the pen tip, and is supplied to the sensor controller via corresponding ones of the FPC connector terminals. The sensor controller detects the position of the stylus on a touch surface by determining the X-coordinate of the stylus based on the reception levels of the pen signal at the X-electrodes, and by determining the Y-coordinate of the stylus based on the reception levels of the pen signal at the Y-electrodes.

JP 2014-063249 A discloses a position detection device that can detect both a finger and a stylus. According to this position detection device, effects of external noise are eliminated by inputting signals, which have been received at electrodes, into a differential amplifier and determining the position of the finger or stylus based on the reception levels of output signals from the differential amplifier. A position detection method, which is performed using a differential amplifier as described above, will hereinafter be called "the differential method."

BRIEF SUMMARY

In the above-described conventional sensor, especially if the pen tip of the stylus is located in the bezel area, however, a problem arises in that the pen signal may be (unintendedly) received by some FPC connector terminals, which results in an unintended line being drawn on a screen.

According to one aspect of the present disclosure, a sensor is provided which is capable of preventing an unintended line being drawn on a screen.

In detecting a position using the above-mentioned differential method, accurate elimination of effects of external noise depends on that the same amount of noise exists in each of reception signals inputted concurrently into the differential amplifier for. Even if the amounts of noise received at the electrodes are equal, a situation may arise that the amounts of noise received at corresponding routing traces in the bezel area may differ significantly, resulting in a problem that the detection of the position may become less accurate.

Therefore, according to another aspect of the present disclosure, a sensor is provided which is capable of providing improved accuracy in the detection of a position when the detection of signals is performed using the differential method.

According to a first aspect of the present disclosure, a sensor is provided for detecting a pen signal transmitted from a pen. The sensor includes a touch sensor having first electrodes, which form a position detection area and are configured to respectively detect the pen signal. The sensor includes FPC connector terminals including first FPC connector terminals, which are connected to the respective first electrodes via first routing traces arranged in a region outside the position detection area. The sensor includes a detection pattern, which is arranged in the region outside the position detection area and adjacent to the FPC connector terminals, and which is configured to detect the pen signal.

According to a second aspect of the present disclosure, a sensor is provided for detecting a pen signal transmitted from a pen. The sensor includes a touch sensor having first electrodes and second electrodes, which form a position detection area and are configured to respectively detect the pen signal. The sensor includes first FPC connector terminals arranged in a first region outside the position detection area, which are connected to the first electrodes, respectively, and second FPC connector terminals arranged in a second region outside the position detection area, which are connected to at least some of the second electrodes. The first region and the second region are separated by a distance greater than a width of a reachable range of the pen signal on the touch sensor.

According to a third aspect of the present disclosure, a sensor is provided for detecting a pen signal transmitted from a pen. The sensor includes a touch sensor having first electrodes, which form a position detection area and are configured to respectively detect the pen signal. The sensor includes first FPC connector terminals, which are arranged at equal intervals outside the position detection area, and are connected to the first electrodes, respectively. The sensor includes first routing traces, which are arranged at equal intervals outside the position detection area, and which connect the first electrodes to the first FPC connector terminals, respectively. The first routing traces have portions arrayed across a width (i.e., a collective width of the first routing traces) that is smaller than the collective width of the first FPC connector terminals.

According to the first aspect of the present disclosure, the sensor controller can determine whether or not the pen is located near any FPC connector terminal, by confirming detected conditions of a pen signal at the detection pattern. If the pen is located near any FPC connector terminal, the pen's position, even if detected, can be discarded as one detected based on a pen signal received by the FPC connector terminal. It is, accordingly, possible to prevent an unintended line being drawn on a screen.

According to the second aspect of the present disclosure, it is possible to avoid reception of a pen signal at both of the first FPC connector terminals and the second FPC connector terminals. It is, therefore, possible to prevent a pen signal from being received at both of the first FPC connector terminals and the second FPC connector terminals, and thus to prevent an unintended line being drawn on a screen.

According to the third aspect of the present disclosure, the first routing traces are arrayed across a width (i.e., a collective width of the first routing traces) that is smaller than the width of the FPC connector terminals (i.e., a collective width of the FPC connector terminals), wherein the width of the FPC connector terminals cannot be minimized due to various constraints. Therefore, it is possible to reduce, to a minimum extent, a difference in the amounts of noise received at the routing traces. The accuracy of position detection, which is performed using the differential method, can be improved accordingly.

DETAILED DESCRIPTION

With reference to the accompanying drawings, a description will hereinafter be made in detail about embodiments of the present disclosure.

Figure 1:
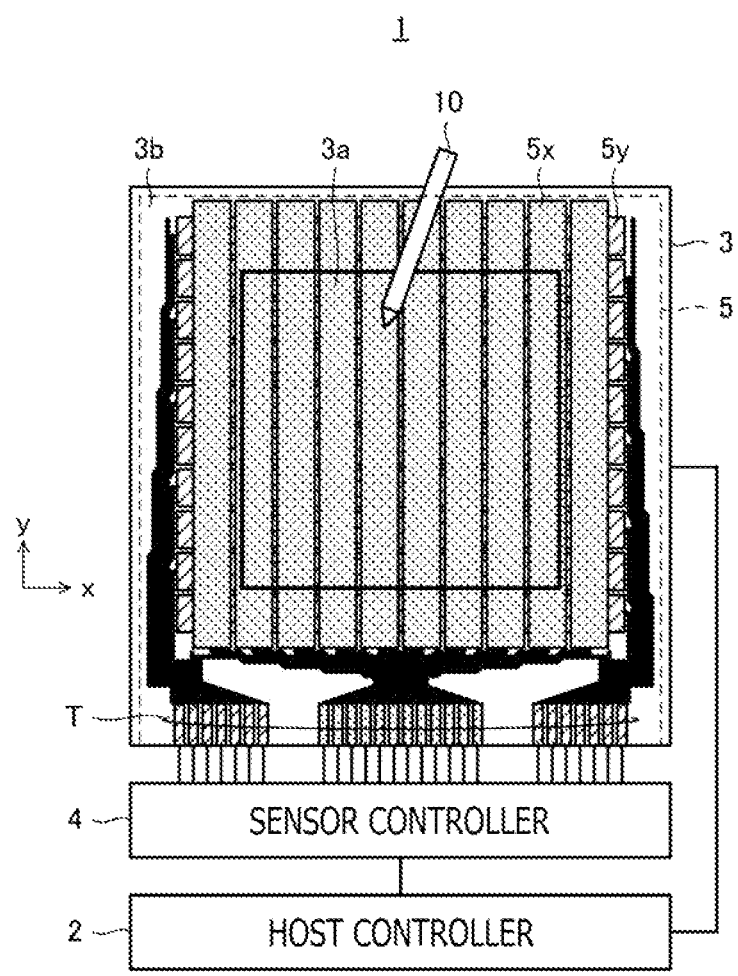
FIG. 1 is a schematic view illustrating the configurations of an electronic device and a stylus according to a first embodiment of the present disclosure.

FIG. 1 is a view illustrating the configurations of an electronic device 1 and a stylus 10 (*pen*) according to a first embodiment of the present disclosure. The electronic device 1 according to this embodiment is, for example, a tablet computer, and as illustrated in FIG. 1, is configured to have a host controller 2, a display device 3, a sensor controller 4, and a touch sensor 5. The stylus 10 is an active stylus as defined above.

The host controller 2 is a computer that has a processor and a memory (both unillustrated). The processor reads and executes programs stored in the memory to perform various types of processing, such as execution of diverse applications including applications that control individual units, such as the illustrated display device 3 and the sensor controller 4 in the electronic device 1, and drawing applications. The memory includes a main memory such as a dynamic random access memory (DRAM) and an auxiliary storage device such as a flash memory.

The display device 3 includes a display panel (not illustrated) having pixels arranged in a matrix form, and a drive circuit (not illustrated) that performs a desired display by driving the display panel. The display device 3 is constructed, for example, of a liquid crystal display, an organic electro-luminescence (EL) display, an electronic paper, or the like. On a surface of the display panel, a display area 3*a* and a bezel area 3*b* are disposed. The display area 3*a* is an area where the pixels are arranged, while the bezel area 3*b* is an area where the drive circuit and routing traces, which connect the individual pixels in the display area 3*a* to the drive circuit, are arranged. The drive circuit is configured to drive the individual pixels of the display panel responsive to control by the host controller 2.

The sensor controller 4 and the touch sensor 5 are input devices (sensors) for the host controller 2. Described specifically, first, the touch sensor 5 is a device having a touch surface and linear electrodes 5*x* and linear electrodes 5*y* arranged right underneath the touch surface. The touch surface is a plane to be touched by the stylus 10 or a user's finger. A position detection area is, therefore, formed in the touch surface. The position detection area enables the detection of a position by using the linear electrodes 5*x* and 5*y* as will be described in detail below, and has a slightly greater area than the display area 3*a*. The touch surface is superimposed over the display panel of the display device 3, and the linear electrodes 5*x* and 5*y* are disposed between the touch surface and the display panel. The linear electrodes 5*x* each extend in a y-direction indicated in FIG. 1 (a direction in the touch surface), and are disposed at equal intervals in an x-direction indicated in FIG. 1 (a direction intersecting at right angles with the y-direction in the touch surface). On the other hand, the linear electrodes $5y$ each extend in the x-direction indicated in FIG. 1, and are arranged at equal intervals in the y-direction indicted in FIG. 1. Either the linear electrodes $5x$ or the linear electrodes $5y$ may also be used as common electrodes (not illustrated) in the display panel, and an electronic device 1 of such a configuration is called "in-cell type." In FIG. 1 and the figures to be referred to subsequently, only ten (10) each of the linear electrodes $5x$ and the linear electrodes $5y$ are illustrated to facilitate easy understanding of the figures, but of course greater numbers of the linear electrodes $5x$ and the linear electrodes $5y$ may be arranged in actual implementations.

The sensor controller 4 is a microcomputer having a processor and a memory (both not illustrated), and is programmed to read and execute programs stored in the memory so that a position pointed by the stylus 10 or a user's finger (not illustrated) on the touch surface can be detected, and data signals transmitted from the stylus 10 can be received. The detection of the position pointed by the stylus 10 is performed by a capacitance method or an active capacitive coupling method. On the other hand, the detection of the position pointed by the user's finger is performed by the capacitance method.

According to the capacitance method, a position pointed by the stylus 10 or a user's finger is detected based on variations in capacitance between the linear electrodes $5x$ and $5y$ and a pen electrode (not illustrated) positioned near the pen tip of the stylus 10 or the user's finger. If the detection of a position is performed by the capacitance method, the sensor controller 4 sequentially supplies a predetermined detecting signal to the individual linear electrodes $5x$. Every time the predetermined detecting signal is supplied, the sensor controller 4 measures the electric potentials of the linear electrodes $5y$. If the pen electrode or a user's finger is close to the intersection of one of the linear electrodes $5x$ and one of the linear electrodes $5y$, a portion of a current, which flows from the linear electrode $5x$ toward the linear electrode $5y$, flows out toward the user's body, so that the electric potential measured at the linear electrode $5y$ is lowered. The sensor controller 4 detects a pointed position by using this change in electric potential.

According to the active capacitive coupling method, a pen signal transmitted by the stylus 10 is received by the touch sensor 5, and based on the reception results, the position pointed by the stylus 10 is detected. As mentioned above, the pen signal includes a position signal, which is an unmodulated burst signal, and data signals representing various data of the stylus 10. Such various data include writing pressure data, which represents a pressure applied to the pen tip of the stylus 10, or the like.

If detection of a pointed position is performed by the active capacitive coupling method, the sensor controller 4 receives a position signal at the linear electrodes $5x$ and the linear electrodes $5y$, respectively, and based on the reception results, detects the position pointed by the stylus 10. Further, the sensor controller 4 performs reception of data signals detected and transmitted by the stylus 10, by using those linear electrodes $5x$ and $5y$ that are the closest to the detected pointed position.

Detection of the pointed position by the sensor controller 4 is described in more detail. The sensor controller 4 in this embodiment is programmed to detect the position pointed by the stylus 10 or the user's finger in accordance with the above-mentioned method (the differential method), which uses a differential amplifier to reduce effects of noise that is supposedly similar among the linear electrodes $5x$ and $5y$ (for example, noise occurring in the display device 3).

Described specifically, first, if detection is performed by the capacitance method, the sensor controller 4 sequentially focuses on the individual linear electrodes $5x$. Every time each linear electrode $5x$ is focused, the sensor controller 4 supplies the predetermined detecting signal to one or more adjacent linear electrodes $5x$ including the focused linear electrode $5x$. In this state, the sensor controller 4 sequentially focuses on the individual linear electrodes $5y$. Every time each linear electrode $5y$ is focused, the sensor controller 4 connects the focused linear electrode $5y$ and another linear electrode $5y$, which is separated by a predetermined number of linear electrodes, including zero (0) linear electrode, from the focused linear electrode $5y$, to a noninverting input terminal and an inverting input terminal of a differential amplifier, respectively. Based on the electric potential of an output signal from the differential amplifier, the sensor controller 4 detects the position pointed by the stylus 10 or the user's finger.

Next, detection performed by the active capacitive coupling method is described. When performing detection of an x-coordinate, the sensor controller 4 sequentially focuses on the individual linear electrodes $5x$. Every time each linear electrode $5x$ is focused, the sensor controller 4 connects the focused linear electrode $5x$ and another linear electrode $5x$, which is separated by a predetermined number of linear electrodes, including zero (0) linear electrode, from the focused linear electrode $5x$, to a noninverting input terminal and an inverting input terminal of a differential amplifier, respectively. Based on the electric potential of an output signal from the differential amplifier, the sensor controller 4 detects the x-coordinate of the position pointed by the stylus 10. Similarly, when performing detection of a y-coordinate, the sensor controller 4 sequentially focuses on the individual linear electrodes $5y$. Every time each linear electrode $5y$ is focused, the sensor controller 4 connects the focused linear electrode $5y$ and another linear electrodes $5y$, which is separated by a predetermined number of linear electrodes, including zero (0) linear electrode, from the focused linear electrode $5y$, to the noninverting input terminal and the inverting input terminal of the differential amplifier, respectively. Based on the electric potential of an output signal from the differential amplifier, the sensor controller 4 detects the y-coordinate of the position pointed by the stylus 10.

According to detection that uses the differential method as described above, the differential amplifier plays, in each of the capacitance method and the active capacitive coupling method, a role of canceling noise that commonly occurs in the linear electrodes $5x$ and $5y$. The sensor controller 4 can, therefore, detect a pointed position accurately without being affected by noise.

The sensor controller 4 is programmed to report to the host controller 2 the coordinates, which indicate the position pointed by the stylus 10 or the user's finger and detected as described above, and various data, which are included in data signals received from the stylus 10. In addition, the sensor controller 4 is programmed to perform, based on writing pressure data received from the stylus 10, acquisition of pen-down information, which represents that the stylus 10 has come into contact with the touch surface, and pen-up information, which represents that the stylus 10 is separated from the touch surface, and to report the pen-down information and the pen-up information at their acquisition timings, respectively, to the host controller 2.

Responsive to an input of the coordinates from the sensor controller 4, the host controller 2 performs at least one of display of a pointer or generation of ink data. Of these, the display of the pointer is performed by displaying a predetermined pointer image at a position corresponding to the inputted coordinates on the display area 3a of the display device 3.

The ink data include control points, which are defined by the respective coordinates sequentially supplied from the sensor controller 4, and curve data, which are acquired by inserting predetermined interpolation curves between the individual control points. Regarding the user's finger, the host controller 2 starts generation of ink data by taking, as a trigger, the initiation of input of the coordinates, and ends the generation of the ink data by taking, as a trigger, the end of input of the coordinates. With respect to the stylus 10, on the other hand, the host controller 2 starts generation of ink data by taking, as a trigger, input of pen-down information, and ends the generation of the ink data by taking, as a trigger, input of pen-up information. When generating the ink data with respect to the stylus 10, the host controller 2 also performs control of the width and/or transparency of curve data, which make up the ink data, based on writing pressure data or the like received from the stylus 10. The host controller 2 performs rendering of the generated ink data and displays the resulting image on the display device 3, and at the same time stores the ink data in its memory.

The sensor controller 4 is disposed on a flexible printed circuit (FPC) board, which is not illustrated. The touch sensor 5 has FPC connector terminals T arranged outside the position detection area, and via these FPC connector terminals T, are pressure bonded to the flexible printed circuit (FPC) board on which the sensor controller 4 is arranged.

Figure 2:
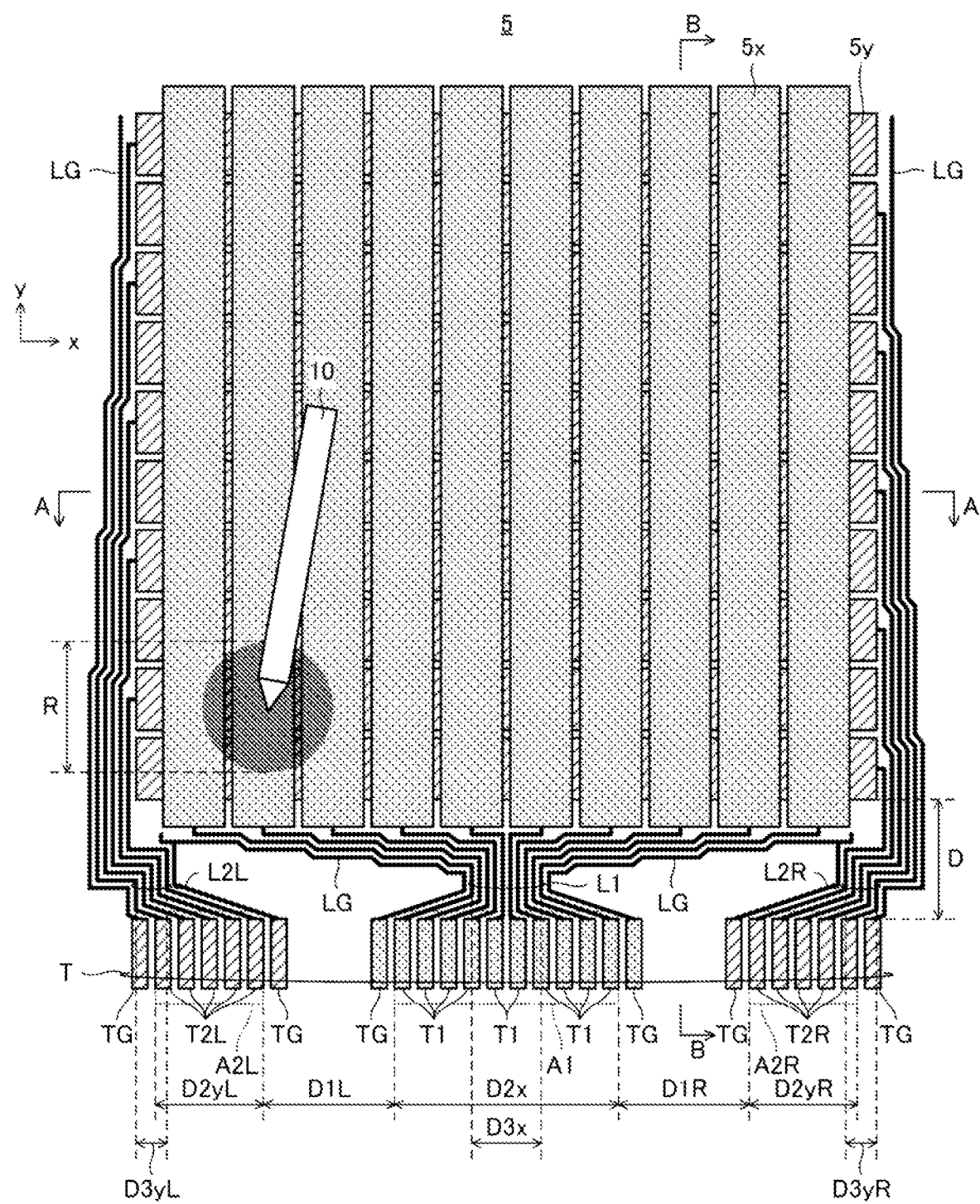
FIG. 2 is an enlarged view of a touch sensor of FIG. 1.
Figure 3:
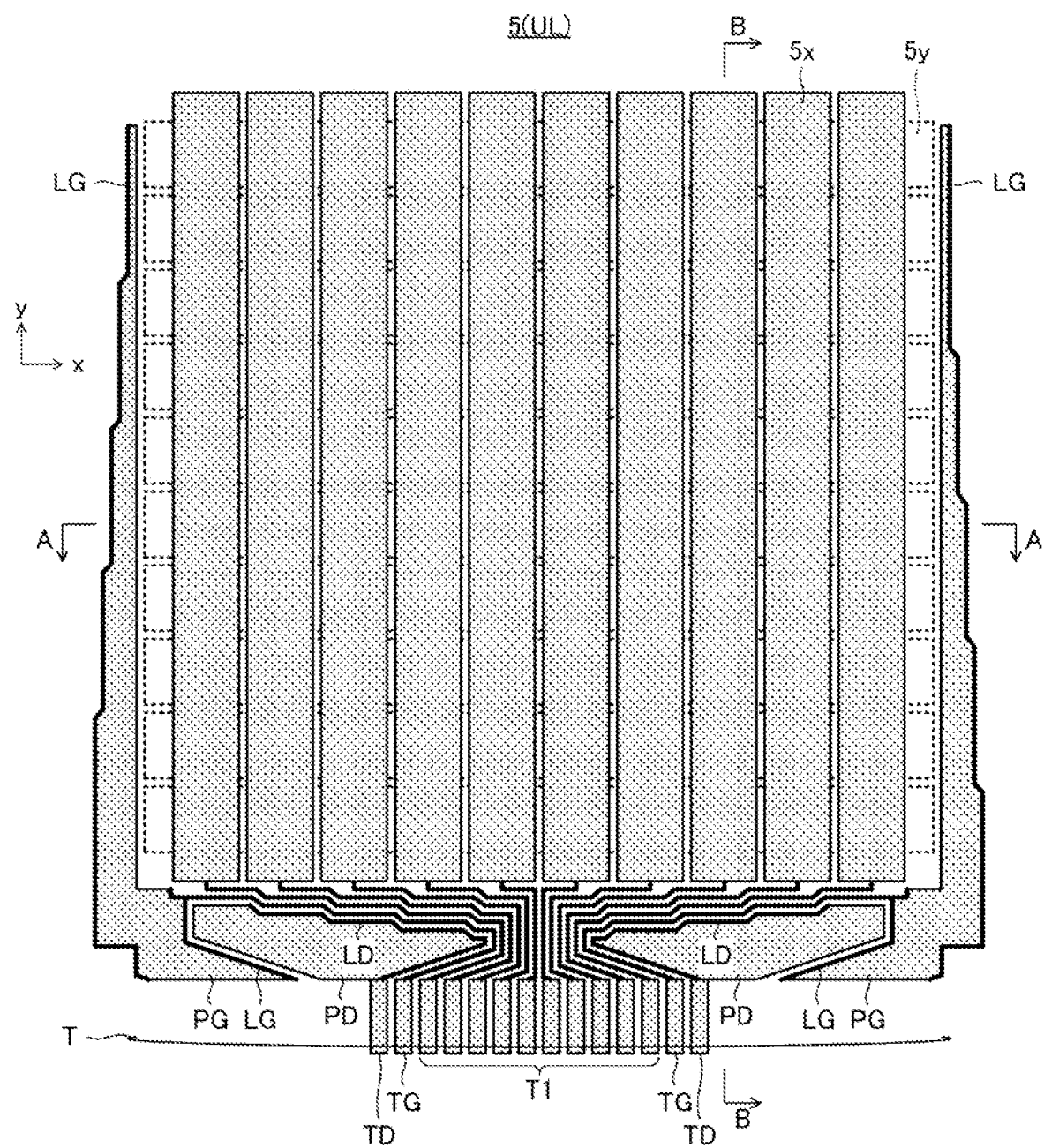
FIG. 3 is a view illustrating only some elements of the touch sensor of FIG. 2, which are formed in an upper layer.
Figure 4:
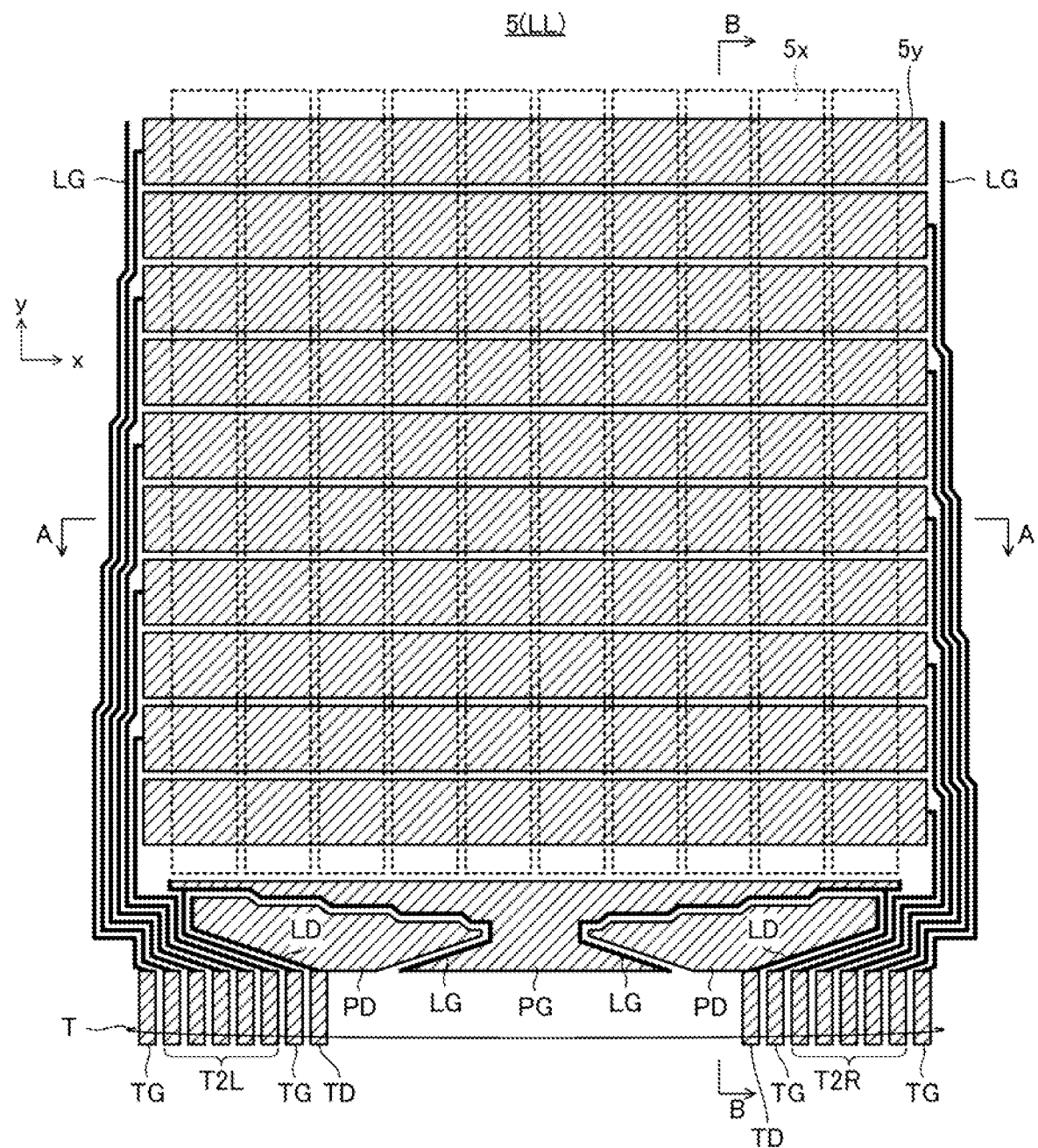
FIG. 4 is a view illustrating only some other elements of the touch sensor of FIG. 2, which are formed in a lower layer.
Figure 5A:
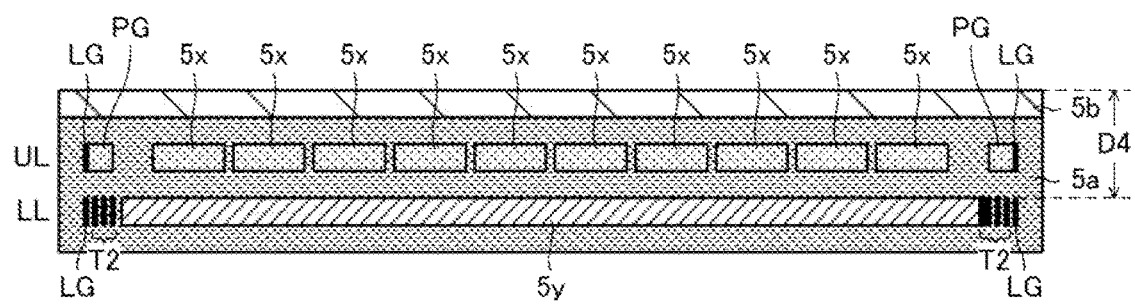
FIG. 5A is a cross-sectional view of the touch sensor corresponding to line A-A of FIGS. 2 to 4.

FIG. 2 is an enlarged view of the touch sensor 5. The touch sensor 5 has a two-layer structure. In FIG. 2 and other figures to be referred to below, the elements illustrated with a dot pattern are those arranged in an upper layer UL (first layer), and the elements illustrated with slanted lines are those arranged in a lower layer LL (second layer). In FIG. 2, illustration of some elements is omitted in each of the upper layer UL and lower layer LL to facilitate understanding of the figure. FIG. 3 is a view illustrating only some elements of the touch sensor 5 of FIG. 2, which are formed in the upper layer UL. FIG. 4 is a view illustrating only some other elements of the touch sensor 5 of FIG. 2, which are formed in the lower layer LL. FIG. 5A is a cross-sectional view of the touch sensor 5 corresponding to line A-A of FIGS. 2 to 4, and FIG. 5B is a cross-sectional view of the touch sensor 5 corresponding to line B-B of FIGS. 2 to 4.

Figure 5B:
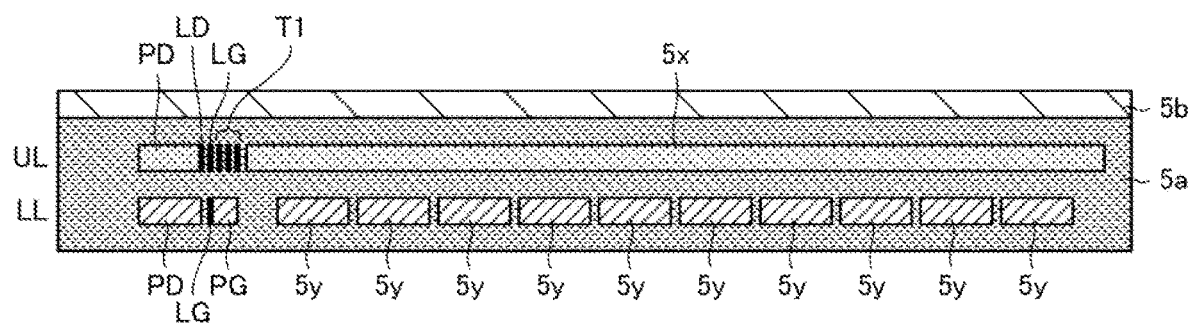
FIG. 5B is a cross-sectional view of the touch sensor corresponding to line B-B of FIGS. 2 to 4.

First, referring specifically to the cross-sectional views of FIGS. 5A and 5B, the touch sensor 5 is configured having an insulating layer 5a, in which the upper layer UL and lower layer LL are formed, and a cover glass 5b formed on an upper side of the insulating layer 5a. An upper surface of the cover glass 5b forms the touch surface (the surface with which the stylus 10 or user's finger comes into direct contact) of the touch sensor 5.

The insulating layer 5a may be formed, for example, by bonding a film, on which the individual elements in the upper layer UL are formed, and another film, on which the individual elements in the lower layer LL are formed, together (as a film sensor), or by forming an upper insulating layer, the upper layer UL, a middle insulating layer, the lower layer LL and a lower insulating layer successively in this order on a lower surface of the cover glass 5b in accordance with a thin film process (as a one glass solution (OGS) sensor). In the former case, no connection can be made between the upper layer UL and the lower layer LL. In the latter case, however, the upper layer UL and the lower layer LL can be connected to each other via through-hole conductors extending through the middle insulating layer. In the present embodiment, a description will be given based on the case, in which no connection is made between the upper layer UL and the lower layer LL, as in the former case. The latter case, in which the upper layer UL and the lower layer LL are connected via through-hole conductors, will be described in a third modification to be described below.

As illustrated in FIGS. 2 to 4, the linear electrodes 5x (first electrodes) are all arranged in the upper layer UL, while the linear electrodes 5y (second electrodes) are all arranged in the lower layer LL. Further, the FPC connector terminals T are configured including FPC connector terminals T1 (first FPC connector terminals) arranged in the upper layer UL, FPC connector terminals T2L (second FPC connector terminals) arranged in the lower layer LL, FPC connector terminals T2R (third FPC connector terminals) arranged in the lower layer LL, FPC connector terminals TG arranged in the upper layer UL or lower layer LL, and FPC connector terminals TD arranged in the upper layer UL or lower layer LL.

The FPC connector terminals T1 are connected to the linear electrodes 5x, respectively, via routing traces L1 (first routing traces) arranged in the upper layer UL. The FPC connector terminals T2L are connected to at least some of the linear electrodes 5y, respectively, via routing traces L2L (second routing traces) arranged in the lower layer LL. The FPC connector terminals T2R are connected to at least some other linear electrodes 5y, respectively, via routing traces L2R (third routing traces) arranged in the lower layer LL. In this embodiment, the linear electrodes 5y connected to the FPC connector terminals T2L and the linear electrodes 5y connected to the FPC connector terminals T2R are alternately arranged in the y-direction.

The FPC connector terminals T1 are arranged at equal intervals in a region A1 (first region) outside the position detection area. Similarly, the FPC connector terminals T2L are arranged at equal intervals in a region A2L (second region) outside the position detection area, and the FPC connector terminals T2R are arranged at equal intervals in a region A2R (third region) outside the position detection area. The region A2L is disposed on a side opposite to the region A2R with the region A1 interposed between the region A2L and the region A2R. FIGS. 2 to 4 illustrate an example in which the region A2L, the region A1, and the region A2R are arranged in a straight line. However, the arrangement is not limited to this example. For example, the position of the region A1 may be slightly offset in the y-direction relative to a line that connects the regions A2L and A2R.

Assuming that the width of a reachable range of a pen signal on the touch sensor 5 is R as indicated in FIG. 2, the region A1 and the region A2L are separated by a distance greater than the width R. In other words, the region A1 and the region A2L have a separation distance D1L in the x-direction therebetween, which is set at a value greater than the width R (D1L>R). Similarly, the region A1 and the region A2R are separated by a distance greater than the width R. In other words, the region A1 and the region A2R have a separation distance D1R in the x-direction therebetween, which is set at a value greater than the width R (D1R>R). As the specific value of the width R is generally 8 mm or so, the specific values of the separation distances D1L and D1R are each set at a value greater than 8 mm.

The setting of the separation distances D1L and D1R as described above can avoid reception of a pen signal at both the FPC connector terminals T1 and the FPC connector terminals T2L or T2R even when the pen tip of the stylus 10 is located near the FPC connector terminals T. It is, therefore, possible to prevent that a pen signal is received at both the FPC connector terminals T1 and the FPC connector terminals T2L or T2R, which would result in an unintended line being drawn on a screen.

The routing traces L1, routing traces L2L and routing traces L2R are each formed at equal intervals outside the position detection area. The individual routing traces have a specific conductor width and a specific inter-trace spacing width determined so that they are respectively 0.1 mm or smaller, or so that the total value of the conductor width and the inter-trace spacing width is equal to or smaller than a distance D4 between the upper surface of the cover glass 5b and the upper surface of the lower layer LL (see FIG. 5A). Whichever method is used, the respective routing traces L1, routing traces L2L and routing traces L2R, formed as described above, each have an array pitch smaller than the array pitch of the individual FPC connector terminals T. Therefore, the routing traces L1 have portions arrayed across a width $D3x$ ($<D2x$) smaller than a width $D2x$ of the corresponding FPC connector terminals T1 in the array direction (the x-direction), the routing traces L2L have portions arrayed across a width $D3yL$ ($<D2yL$) smaller than a width $D2yL$ of the corresponding FPC connector terminals T2L in the array direction (the x-direction), and the routing traces L2R have portions arrayed across a width $D3yR$ ($<D2yR$) smaller than a width $D2yR$ of the corresponding FPC connector terminals T2R in the array direction (the x-direction). As a consequence, the routing traces L1, routing traces L2L and routing traces L2R, respectively form a fan-like shape expanding toward the corresponding FPC connector terminals T.

The layout of the routing traces L1, L2L, and L2R as described above can reduce, to a minimum extent, a difference in the amounts of noise received at the routing traces. The accuracy of position detection, which is performed using the differential method, can be improved accordingly.

Ground lines LG are arranged on opposite sides of each of the routing traces L1, routing traces L2L and routing traces L2R. Further, the FPC connector terminals TG which are connected to the ground lines LG are arranged on the opposite sides of each of the regions A1, A2L, and A2R. In this embodiment, the ground lines LG are formed in the same shape at the same positions of the upper layer UL and lower layer LL as illustrated in FIGS. 3 and 4. Those ground lines LG not connected directly to the FPC connector terminals TG are connected to some of the FPC connector terminals TG, via other ground lines LG and ground patterns PG to be described below. To each FPC connector terminal TG, a ground electric potential is supplied from the sensor controller 4.

As illustrated in FIGS. 3 and 4, in each of the region between the routing traces L1 and the routing traces L2L and the region between the routing traces L1 and the routing traces L2R, detection lines LD are disposed to extend generally along the corresponding ground lines LG, one each in the upper layer UL and in the lower layer LL (total two detection lines LD in each region). As illustrated in FIG. 3, the two detection lines LD in the upper layer UL are formed along the two ground lines LG located adjacent to the routing traces L1. As illustrated in FIG. 4, the two detection lines LD in the lower layer LL are formed along the ground line LG, which is located adjacent to the routing traces L2L, and along the ground line LG, which is located adjacent to the routing traces L2R, respectively. Further, in each of the region between the region A1 and the region A2L and the region between the region A1 and the region A2R, the FPC connector terminals TD connected to the detection lines LD are arranged, one in the upper layer UL and the other in the lower layer LL (total two FPC connector terminals TD in each region). The two FPC connector terminals TD in the upper layer UL are respectively arranged adjacent to the two FPC connector terminals TG, which in turn are located adjacent to the FPC connector terminals T1. The two FPC connector terminals TD in the lower layer LL are arranged adjacent to the FPC connector terminal TG, which is located adjacent to the FPC connector terminals T2L, and adjacent to the FPC connector terminal TG, which is located adjacent to the FPC connector terminals T2R, respectively.

As illustrated in FIG. 3, two ground patterns PG (second ground patterns) and two detection patterns PD (second detection patterns) are also disposed in the upper layer UL. As illustrated in FIG. 4, one ground pattern PG (first ground pattern) and two detection patterns PD (first detection patterns) are disposed in the lower layer LL. These patterns are not particularly limited to any specific construction or configuration, and may be formed of a uniform conductor or of fine conductive lines (or traces) arranged in a mesh form (mesh lines), for example. No particular limitation is imposed on the material of these patterns insofar as it is a conductive material. These patterns can be formed using any suitable conductive materials such as Mo-Al-Mo (MAM), Mo-Cu-Mo (MCM), Al, Cu, Ag-Pd-Cu (APC), indium tin oxide (ITO), and conductive organic compounds.

One of the two ground patterns PG disposed in the upper layer UL is arranged in a region overlapping the routing traces L2L in a plan view, and as illustrated in FIG. 3, is connected to the two ground lines LG in the upper layer UL located on opposite sides of the routing traces L2L in a plan view. Similarly, the other one of the two ground patterns PG disposed in the upper layer UL is arranged in a region overlapping the routing traces L2R in a plan view, and as illustrated in FIG. 3, is connected to the two ground lines LG in the upper layer UL located on opposite sides of the routing traces L2R in a plan view. Further, the ground pattern PG disposed in the lower layer LL is arranged in a region overlapping the routing traces L1 in a plan view, and as illustrated in FIG. 4, is connected to the two ground lines LG in the lower layer LL located on opposite sides of the routing traces L1 in a plan view.

By arranging the ground lines LG and ground patterns PG as described above, the routing traces L1, routing traces L2L and routing traces L2R are each covered by the ground electric potential at both sides and the upper side or the lower side. Therefore, the routing traces L1, L2L, and L2R are less susceptible to effects of noise coming from these sides (noise from the lateral sides includes noise generated at routing traces), whereby the accuracy of position detection can be improved.

As understood from FIGS. 3 and 4, the two detection patterns PD disposed in the upper layer UL and the two detection patterns PD disposed in the lower layer LL are formed in regions outside the position detection area, near the corresponding FPC connector terminals T. More specifically, these detection patterns PD are formed in the same shape at positions where neither any routing trace nor any ground pattern PG is formed. Further, the two detection patterns PD disposed in the upper layer UL are connected to one and the other of the two detection lines LD disposed in the upper layer UL, respectively, as illustrated in FIG. 3. Similarly, the two detection patterns PD disposed in the lower layer LL are connected to one and the other of the two detection lines LD disposed in the lower layer LL, respectively, as illustrated in FIG. 4.

The detection patterns PD serve to detect a pen signal to determine whether or not the stylus 10 is located near the FPC connector terminals T. The sensor controller 4 is programmed to monitor the electric potentials of the individual FPC connector terminals TD, to thereby determine whether or not the stylus 10 is located near the FPC connector terminals T. Described specifically, if the electric potential of at least one of the FPC connector terminals TD demonstrates a similar variation as the pen signal, this means that the pen signal is received by the adjacent detection pattern PD. The stylus 10 is, therefore, considered to be located near the FPC connector terminals T arranged adjacent to the detection pattern PD. Accordingly, the sensor controller 4 determines that, if the electric potential of at least one of the FPC connector terminals TD demonstrates a similar variation as the pen signal, the stylus 10 is located near the FPC connector terminals T arranged adjacent to the detection pattern PD. If the stylus 10 is determined to be located near the FPC connector terminals T, the sensor controller 4 may stop reporting to the host controller 2 of the position pointed by the stylus 10 as detected by the active capacitive coupling method (in other words, the detected pointed position is discarded).

In this embodiment, the distance D indicated in FIG. 2 (the distance between the FPC connector terminals T and the linear electrode 5y arranged at a position closest to the FPC connector terminals T) is smaller than the above-mentioned width R (the width of the reachable range of a pen signal on the touch sensor 5). If the stylus 10 is located near the FPC connector terminals T, the pen signal may, therefore, be received at both of a linear electrode 5x or a linear electrode 5y and a FPC connector terminal T and a position may be detected by the active capacitive coupling method. As the position detected in this manner does not correctly reflect the position of the stylus 10, the detected position should be excluded from being reported to the host controller 2 in order to prevent an unintended line being drawn on the screen.

In this respect, the above-described operation of the sensor controller 4 in this embodiment stops the reporting of the position pointed by the stylus 10 as detected by the active capacitive coupling method if the stylus 10 is located near the FPC connector terminals T. Therefore, the detected position, which does not correctly reflect the position of the stylus 10, can be prevented from being reported to the host controller 2. It is, accordingly, possible to prevent an unintended line being drawn on the screen.

As is described above, according to the electronic device 1 of this embodiment, the sensor controller 4 can determine, by confirming detection of a pen signal at the detection patterns PD, whether or not the stylus 10 is located near the FPC connector terminals T. If the stylus 10 is located near the FPC connector terminals T, any detected position can be discarded as based on a pen signal received at a FPC connector terminal T. It is, accordingly, possible to prevent an unintended line being drawn on the screen.

According to the electronic device 1 in this embodiment, reception of a pen signal at both of the FPC connector terminals T1 and the FPC connector terminals T2L or T2R can also be avoided. It is, accordingly, possible to prevent an unintended line being drawn on the screen as a consequence of the reception of a pen signal at both of the FPC connector terminals T1 and the FPC connector terminals T2L or T2R.

According to the electronic device 1 of this embodiment, the routing traces L1, L2L, and L2R are each arrayed across a width (i.e., a collective width of the routing traces L1, a collective width of the routing traces L2L, and a collective width of the routing traces L2R) that is smaller than the width of the FPC connector terminals T1, T2L, and T2R in the array direction, respectively (i.e., a collective width of the FPC connector terminals T1, a collective width of the FPC connector terminals T2L, and a collective width of the FPC connector terminals L2R), wherein the width of the FPC connector terminals cannot be minimized due to various constraints. Therefore, it is possible to reduce, to a minimum extent, a difference in the amounts of noise received at the routing traces. The accuracy of position detection, which is performed using the differential method, can be improved accordingly.

A variety of modifications can be made to the present embodiment. Four modification examples will be described below.

Figure 6:
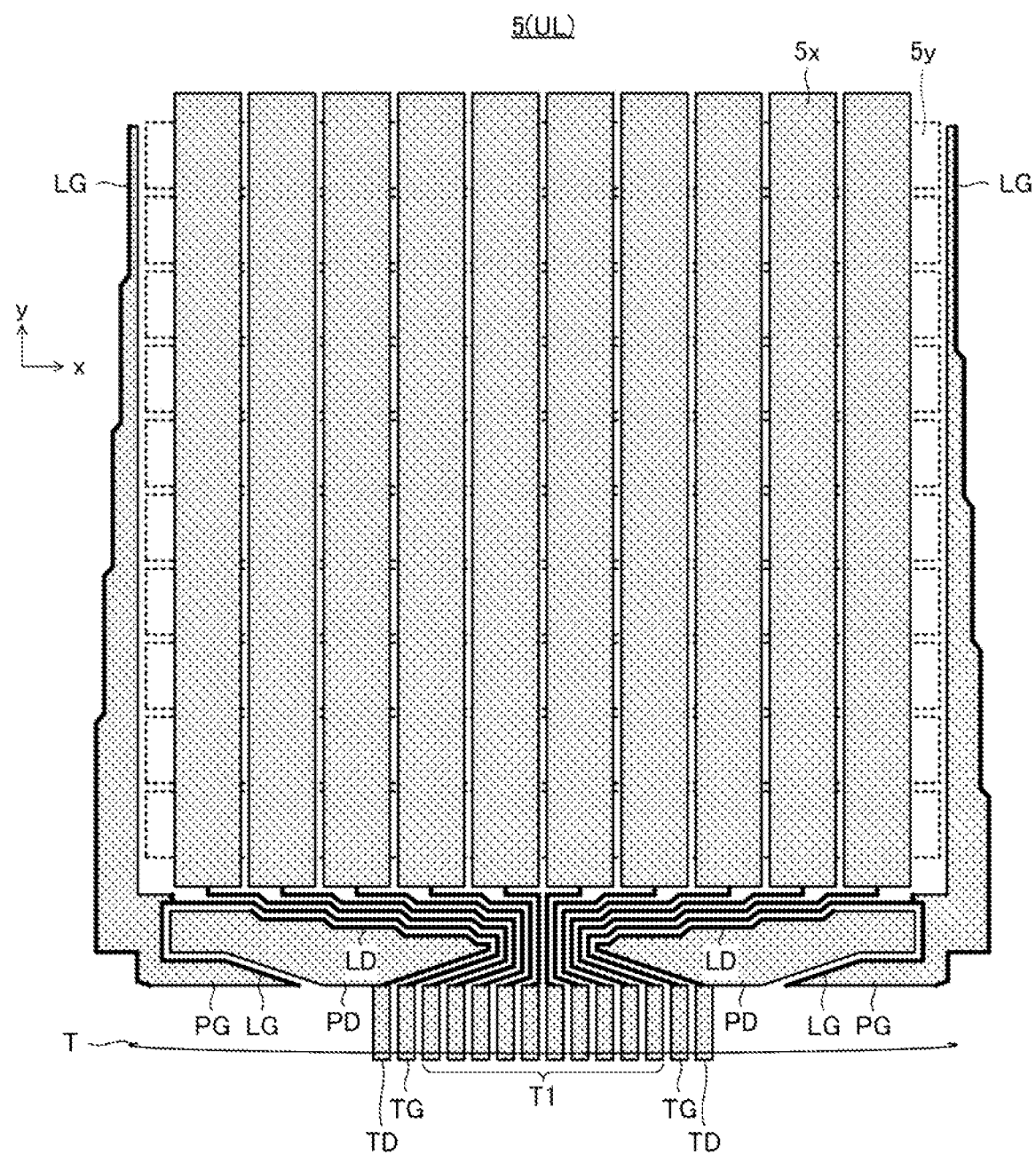
FIG. 6 is a view illustrating only some elements of a touch sensor according to a first modification of the first embodiment of the present disclosure, which are formed in an upper layer.
Figure 7:
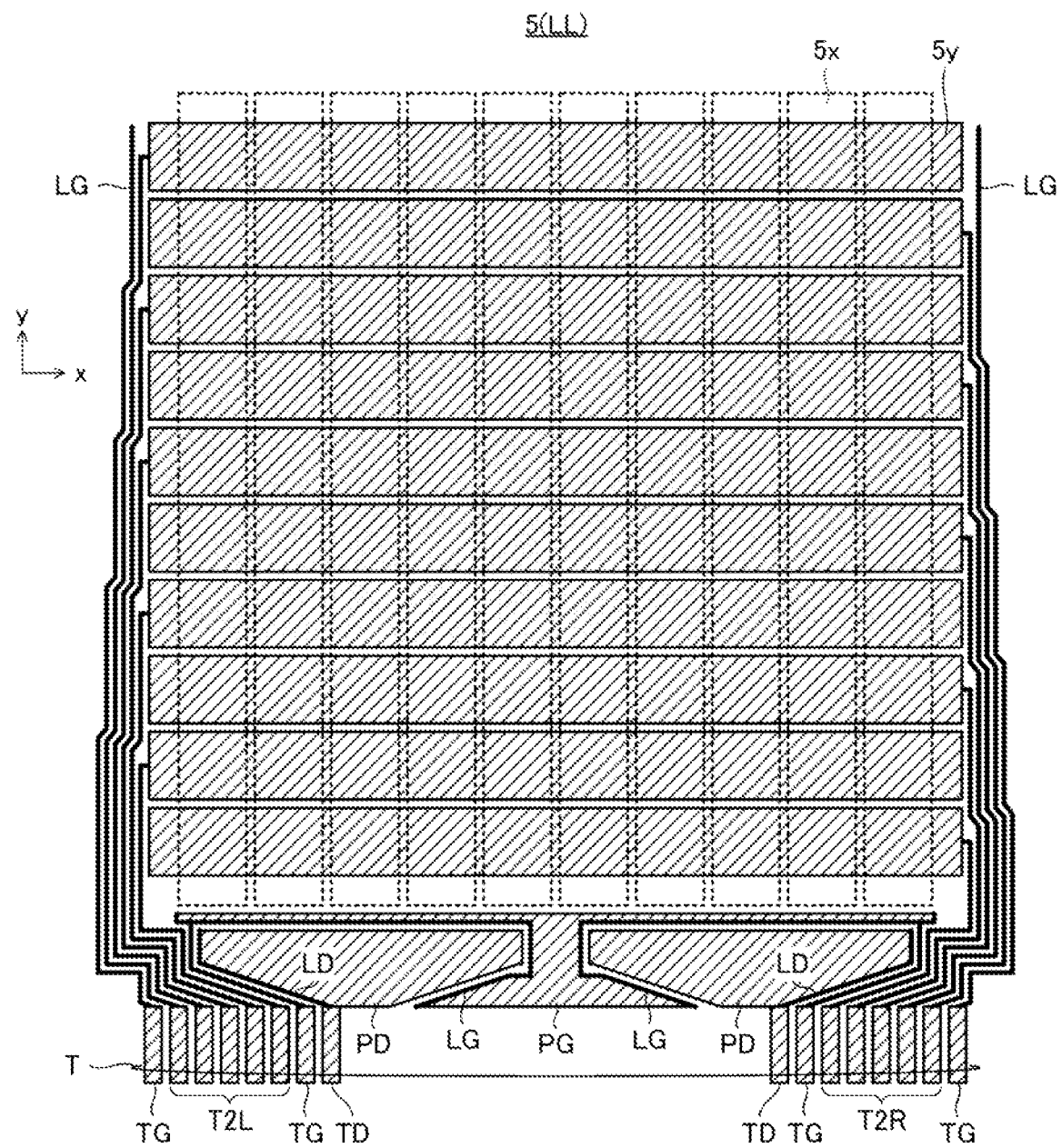
FIG. 7 is a view illustrating only some other elements of the touch sensor according to the first modification of the first embodiment of the present disclosure, which are formed in a lower layer.

FIG. 6 is a view illustrating only some elements of a touch sensor 5 according to a first modification of this embodiment, which are formed in the upper layer UL. FIG. 7 is a view illustrating only some other elements of the touch sensor 5 according to the first modification of this embodiment, which are formed in the lower layer LL.

The first modification features that the detection patterns PD in the lower layer LL include portions arranged in regions overlapping some of the routing traces L1 in a plan view, and the detection patterns PD in the upper layer UL include portions arranged in regions overlapping some of the routing traces L2L and L2R, respectively, in a plan view. Described more specifically, the two detection patterns PD in the lower layer LL are disposed extending to parts of a region overlapping the routing trace L1, respectively, in a plan view. As a consequence, the shape of the ground lines LG in the lower layer LL also changes. On the other hand, one of the two detection patterns PD in the upper layer UL, which is formed adjacent to the routing traces L2L, is arranged extending to a part of a region overlapping the routing traces L2L in a plan view, and the other detection pattern PD formed adjacent to the routing traces L2R is arranged extending to a part of a region overlapping the routing traces L2R in a plan view. As a consequence, the shape of the ground lines LG in the upper layer UL also changes.

As appreciated from the foregoing, each detection pattern PD may be arranged to extend to the region overlapping the adjacent routing traces L1, L2L or L2R in a plan view. If modified as described above, the detection patterns PD can have a greater area.

Figure 8:
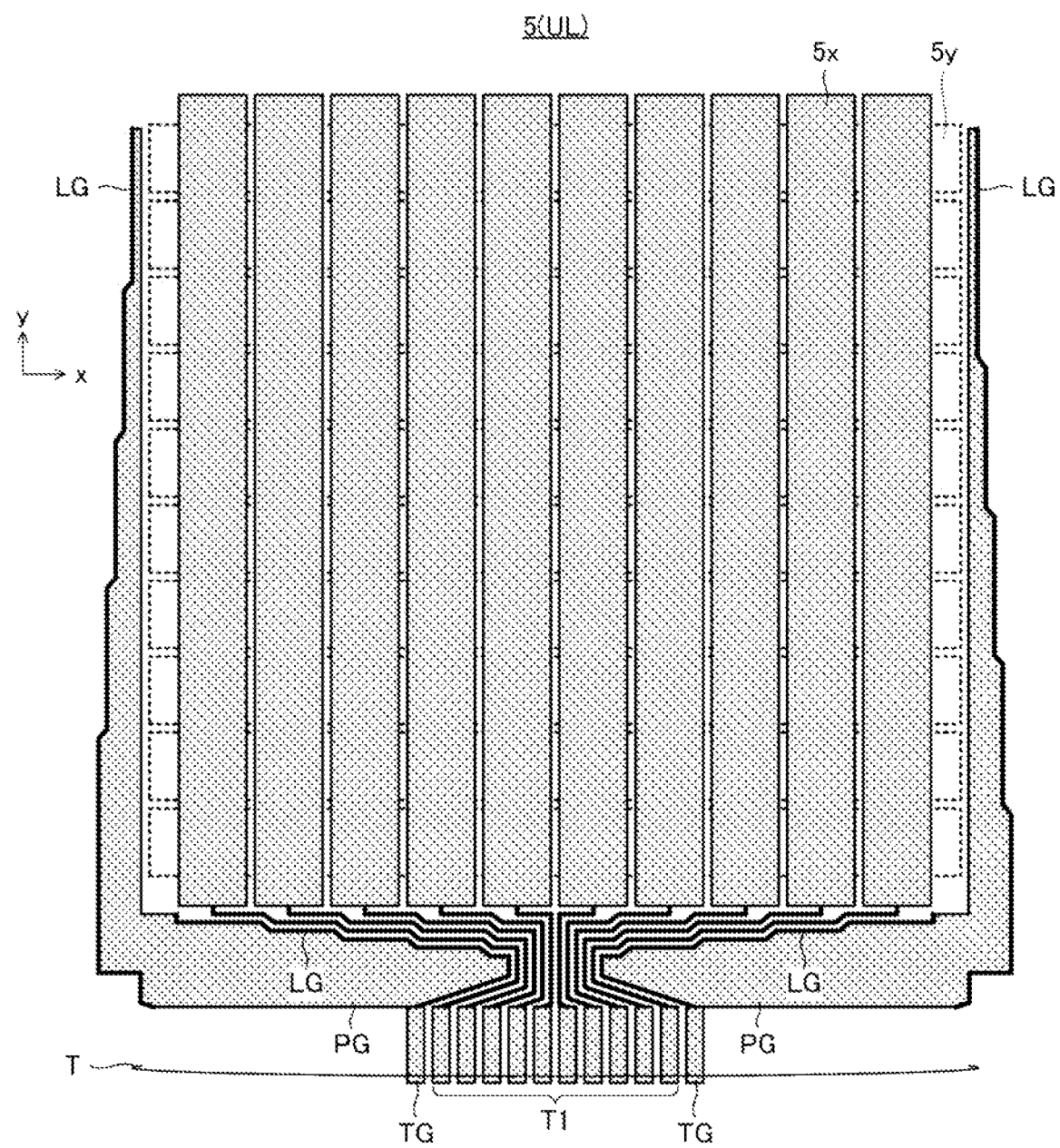
FIG. 8 is a view illustrating only some elements of a touch sensor according to a second modification of the first embodiment of the present disclosure, which are formed in an upper layer.
Figure 9:
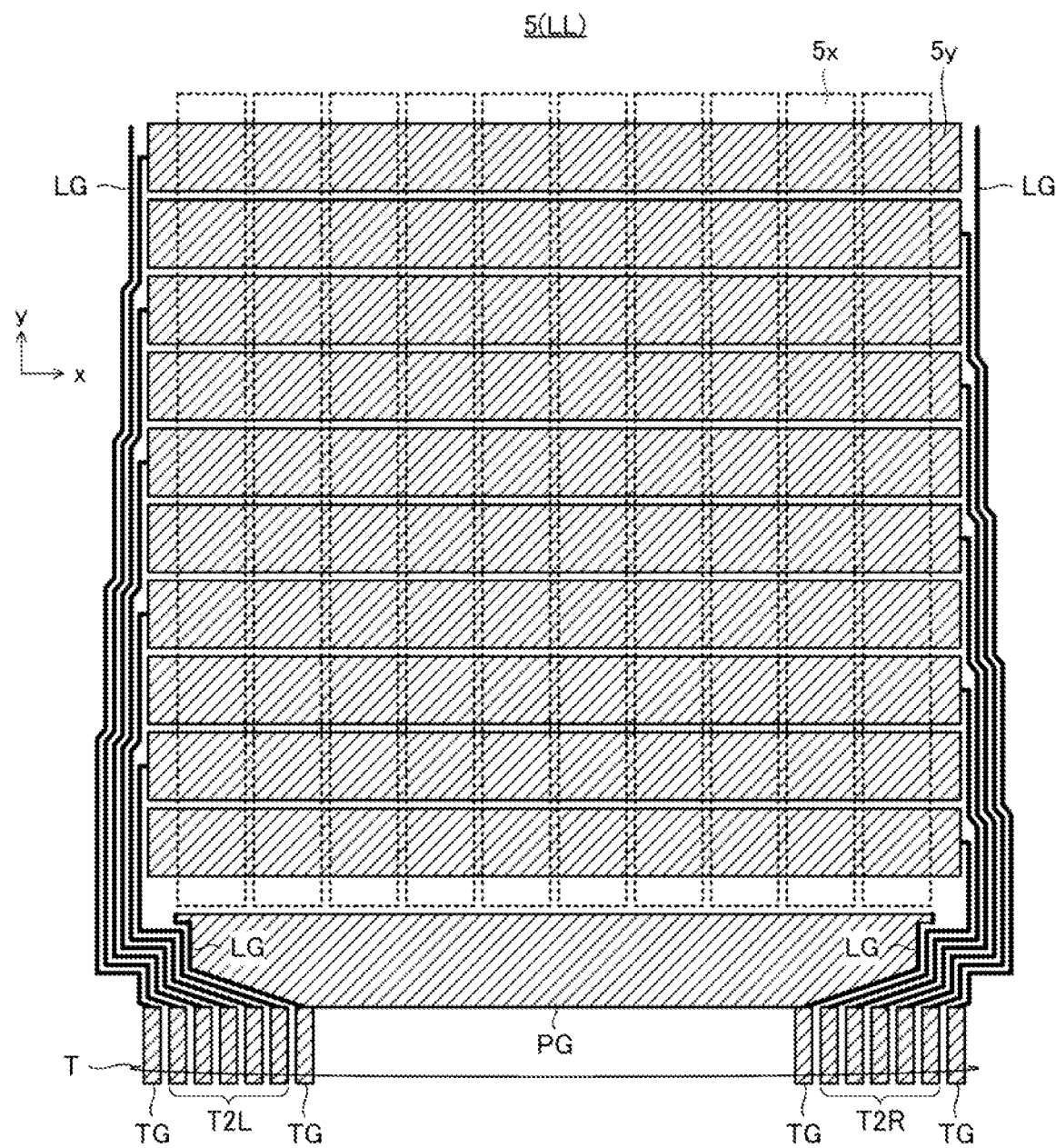
FIG. 9 is a view illustrating only some other elements of the touch sensor according to the second modification of the first embodiment of the present disclosure, which are formed in a lower layer.

FIG. 8 is a view illustrating only some elements of a touch sensor 5 according to a second modification of this embodiment, which are formed in the upper layer UL. FIG. 9 is a view illustrating only some other elements of the touch sensor 5 according to the second modification of this embodiment, which are formed in the lower layer LL.

The second modification features that in each of the upper layer UL and lower layer LL, the ground patterns PG are formed also at positions where the detection patterns PD used to exist in the above-described embodiment. In this modification, neither the detection patterns PD nor the FPC connector terminals TD are disposed. Also omitted from the present modification are the ground line LG located between the detection pattern PD and the ground pattern PG, and the corresponding FPC connector terminal TD.

The sensor controller 4 in this modification is programmed to monitor the electric potentials of the individual FPC connector terminals TG, which are connected to the ground patterns PG, instead of the FPC connector terminals TD and based on the results of the monitoring, to determine whether or not the stylus 10 is located near the FPC connector terminals T. If modified as described above, the sensor controller 4 can also determine whether or not the stylus 10 is located near the FPC connector terminals T. If the stylus 10 is located near the FPC connector terminals T, reporting of a position pointed by the stylus 10 as detected by the active capacitive coupling method can be stopped. As in the above-described embodiment, it is, accordingly, possible to prevent an unintended line being drawn on the screen.

Figure 10:
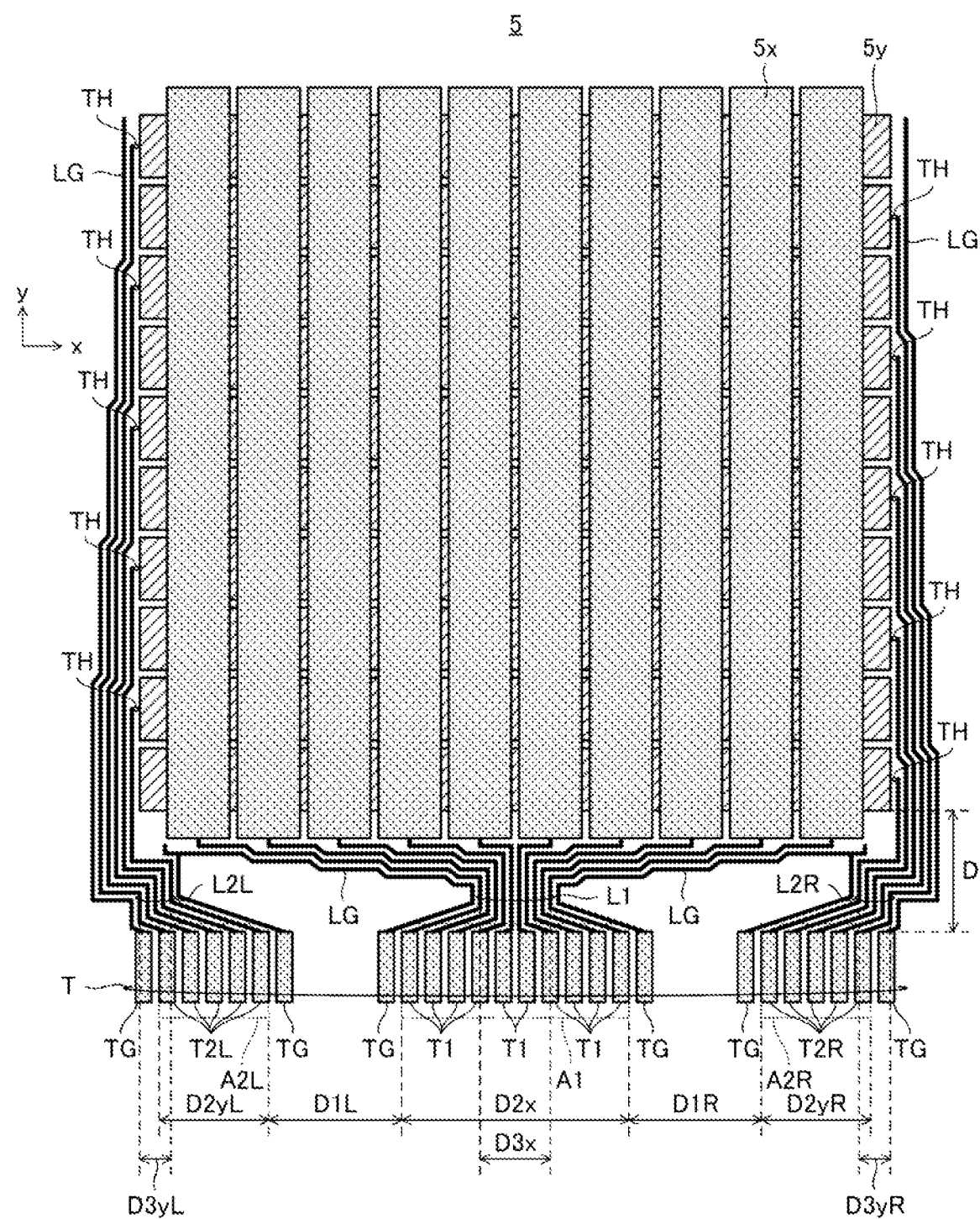
FIG. 10 is an enlarged view of a touch sensor according to a third modification of the first embodiment of the present disclosure.
Figure 11:
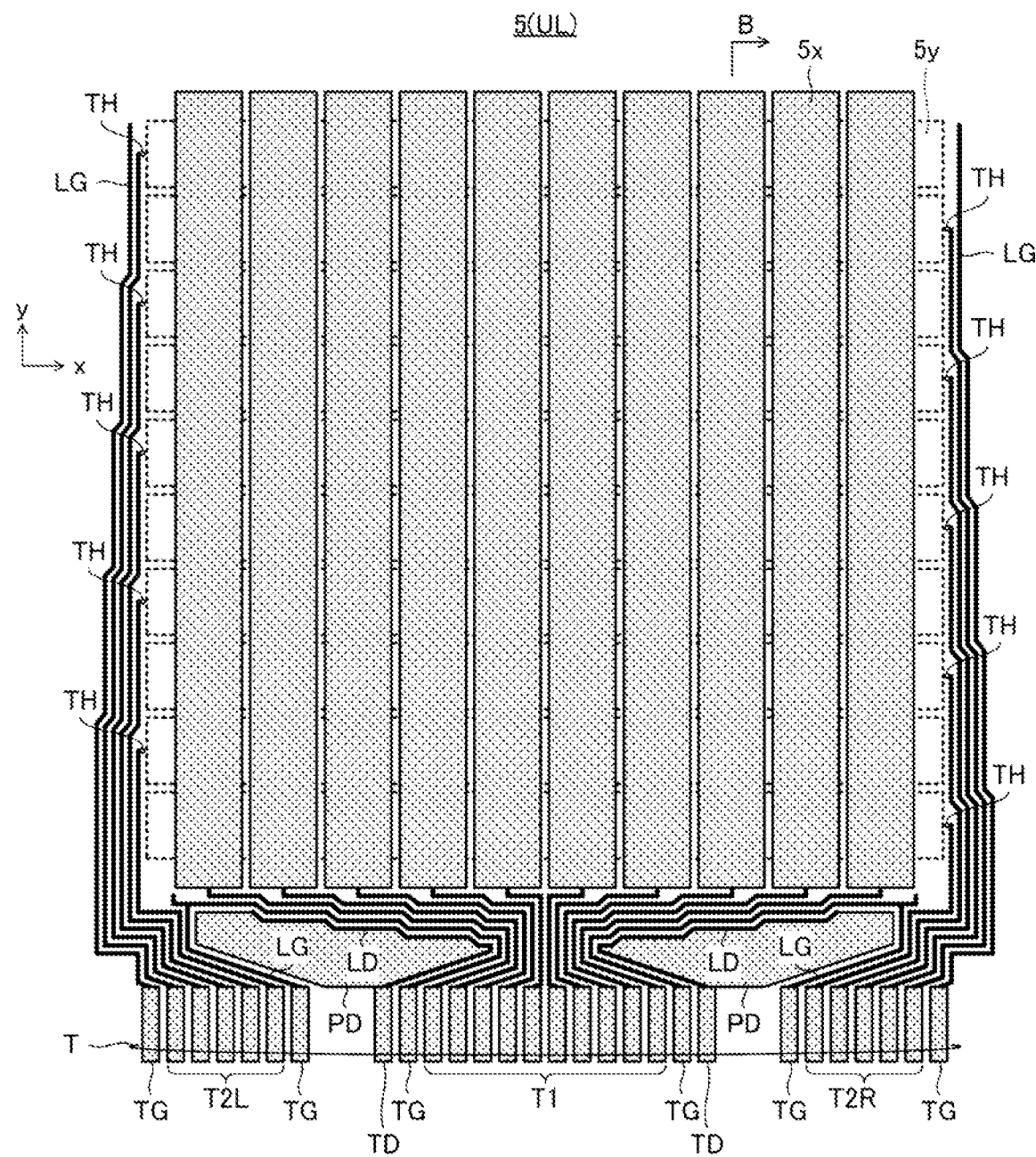
FIG. 11 is a view illustrating some elements of the touch sensor according to the third modification of the first embodiment of the present disclosure, which are formed in an upper layer.
Figure 12:
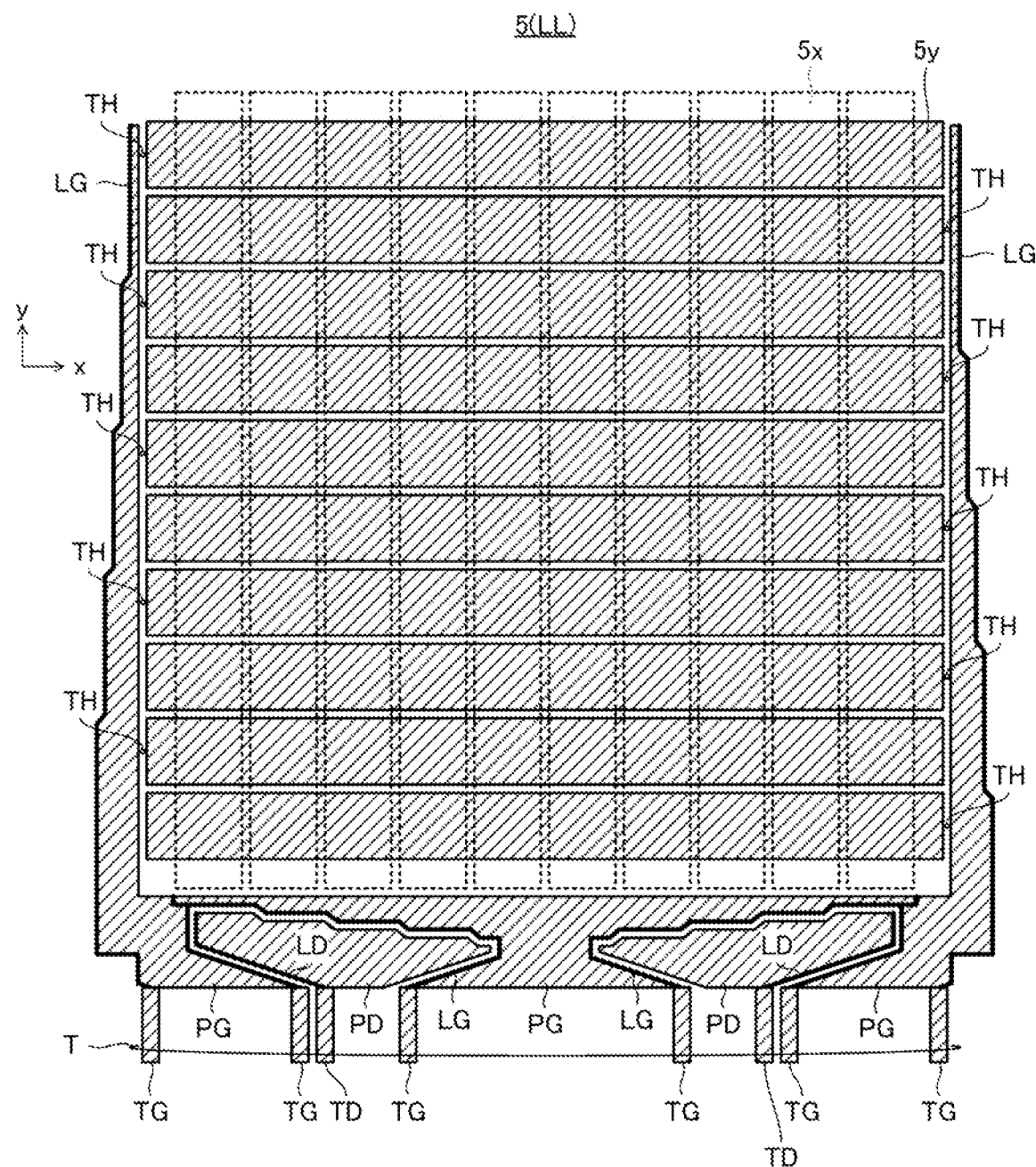
FIG. 12 is a view illustrating only some other elements of the touch sensor according to the third modification of the first embodiment of the present disclosure, which are formed in a lower layer.

FIG. 10 is an enlarged view of a touch sensor 5 according to a third modification of this embodiment. FIG. 11 is a view illustrating some elements of the touch sensor 5 according to the third modification of this embodiment, which are formed in the upper layer UL. FIG. 12 is a view illustrating only some other elements of the touch sensor 5 according to the third modification of this embodiment, which are formed in the lower layer LL.

The third modification features that most portions of the routing traces L2L and L2R and the FPC connector terminals T2L and T2R are formed in the upper layer UL, and ground patterns PG arranged in regions overlapping the routing traces L2L and L2R, respectively, in a plan view are formed in the lower layer LL. The routing traces L2L and L2R are arranged to extend from the lower layer LL to the upper layer UL via through-hole conductors TH disposed near end portions of the corresponding linear electrodes 5y.

According to this modification, the ground patterns PG can be formed all together in the lower layer LL. The routing traces L1, L2L, and L2R can, therefore, be covered at lower sides thereof by the ground electric potential, so that the routing traces L1, L2L, and L2R can each be shielded from noise which occur at the display device 3 located further below the lower layer LL. As a consequence, the accuracy of position detection can be improved further.

Depending on the characteristics of noise and the like, various configurations are possible. For example, the ground patterns PG may be wholly formed in the upper layer UL by arranging the individual routing traces L1 to extend to the lower layer LL via through-hole conductors. As another example, the routing traces L1 may be arranged to extend to the lower layer LL via through-hole conductors, the routing traces L2L and L2R may be arranged to extend to the upper layer UL via through-hole conductors, the ground pattern PG arranged in the region overlapping the routing traces L1 in a plan view may be formed in the upper layer UL, and the ground patterns PG arranged in the regions overlapping the routing traces L2L and L2R, respectively, in a plan view may be formed in the lower layer LL. As another example, the ground lines LG in the upper layer UL and the ground lines LG in the lower layer LL may be connected to each other via through-hole conductors, and the detection lines LD in the upper layer UL and the detection lines LD in the lower layer LL may be connected to each other via through-hole conductors.

Figure 13:
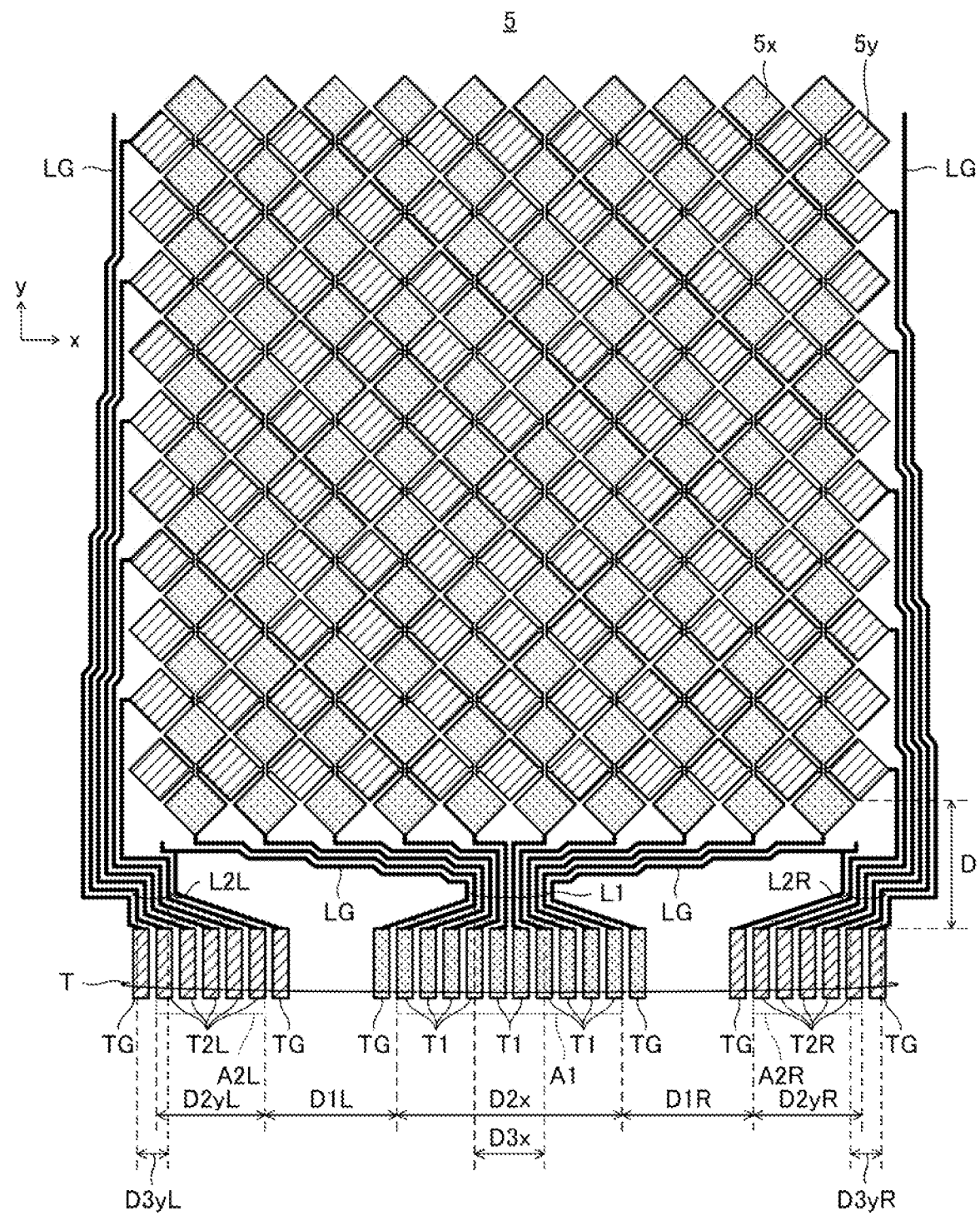
FIG. 13 is an enlarged view of a touch sensor according to a fourth modification of the first embodiment of the present disclosure.

FIG. 13 is an enlarged view of a touch sensor 5 according to a fourth modification of this embodiment.

The fourth modification features that the linear electrodes 5x and 5y are not rectangular but are each formed of a series of squares connected in a diagonal direction. These squares are disposed at intersections between the linear electrodes 5x and the linear electrodes 5y, and each two squares adjacent to each other in the x-direction or in the y-direction are connected together via a fine rectangular bridge conductor.

As described above, the shapes of the linear electrodes 5x and 5y are not required to be rectangular, and the present disclosure can be applied to linear electrodes 5x and 5y of various shapes.

A description of a second embodiment is provided below.

Figure 14:
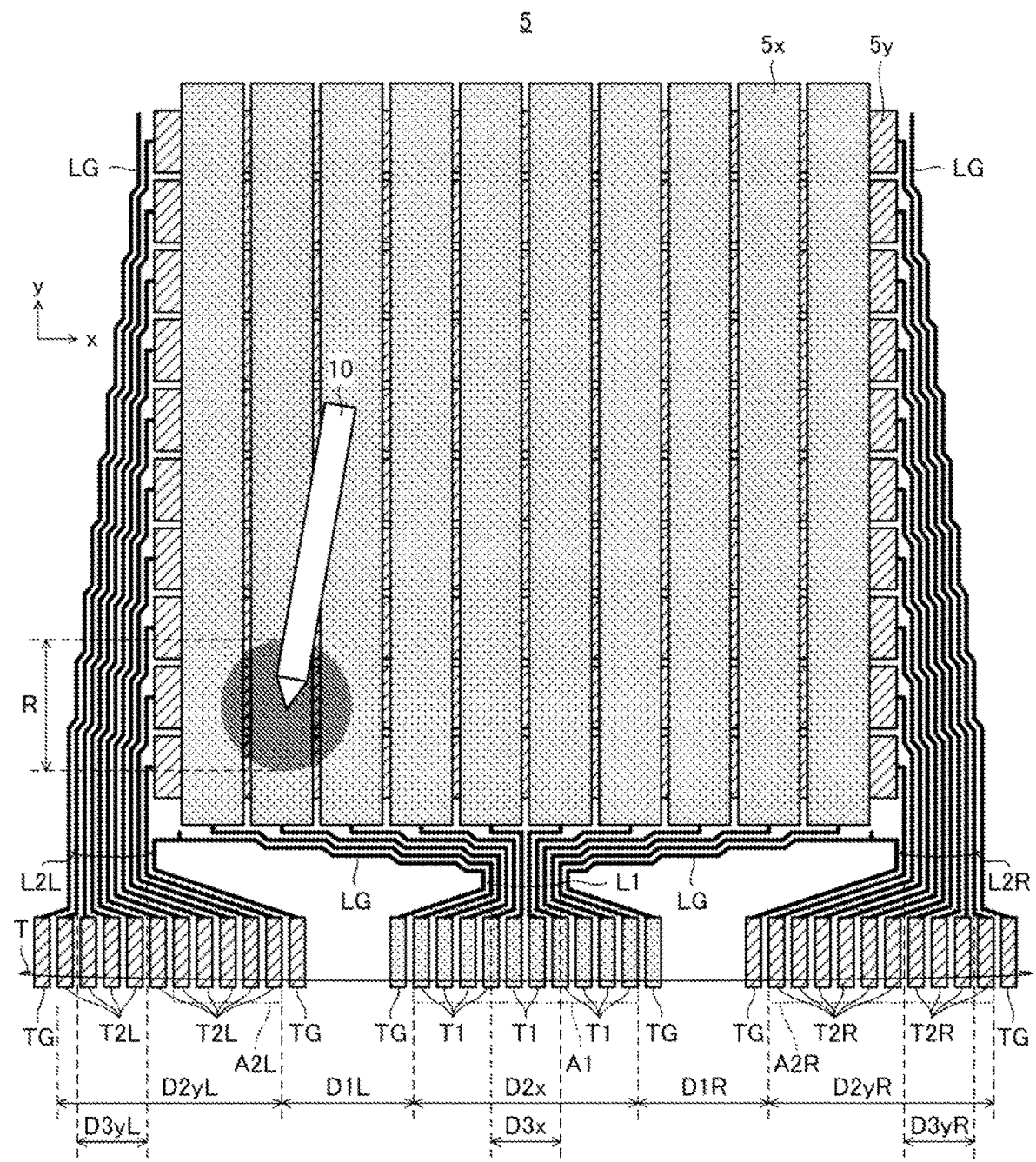
FIG. 14 is an enlarged view of a touch sensor according to a second embodiment of the present disclosure.
Figure 15:
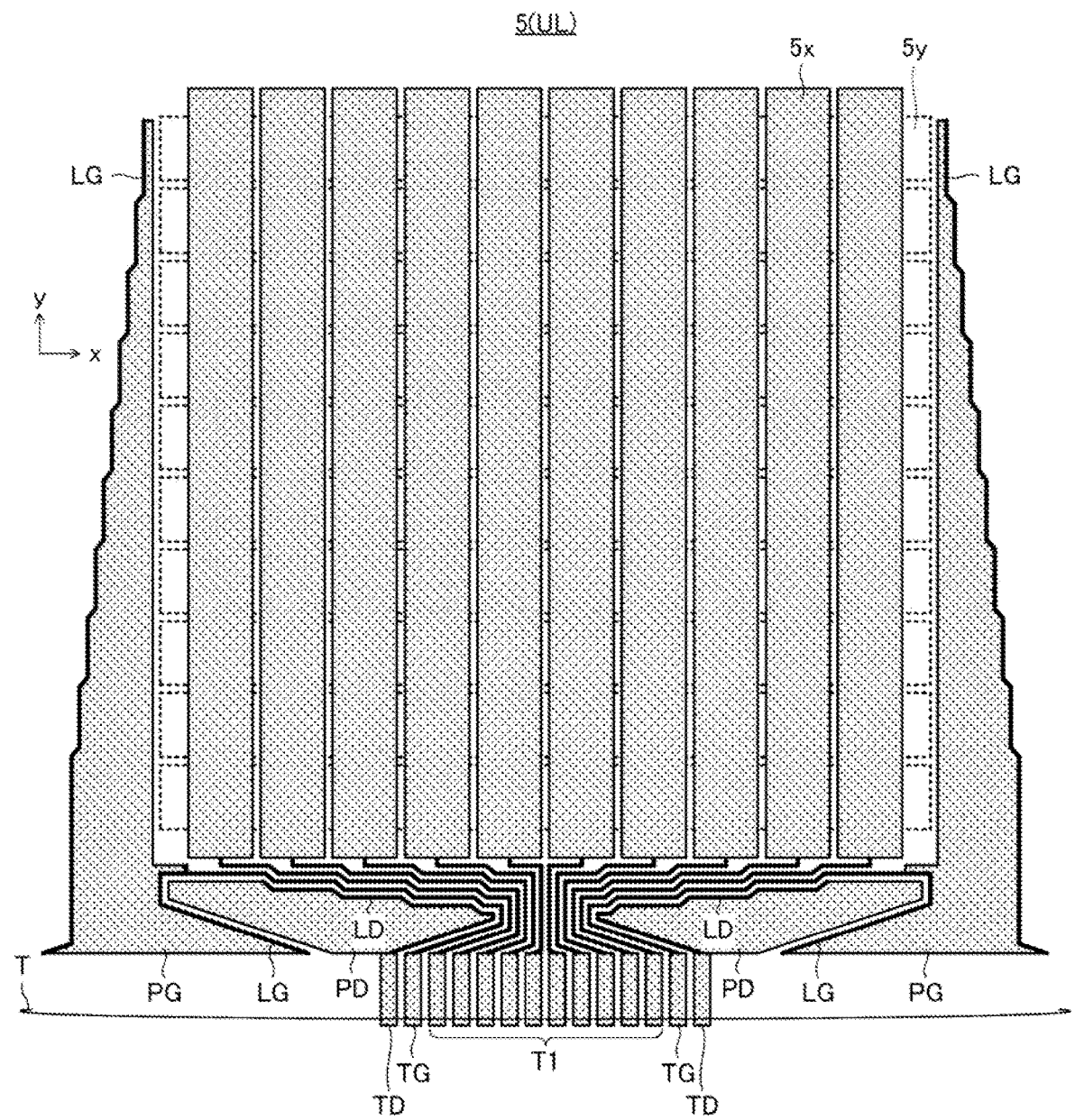
FIG. 15 is a view illustrating only some elements of the touch sensor of FIG. 14, which are formed in an upper layer.
Figure 16:
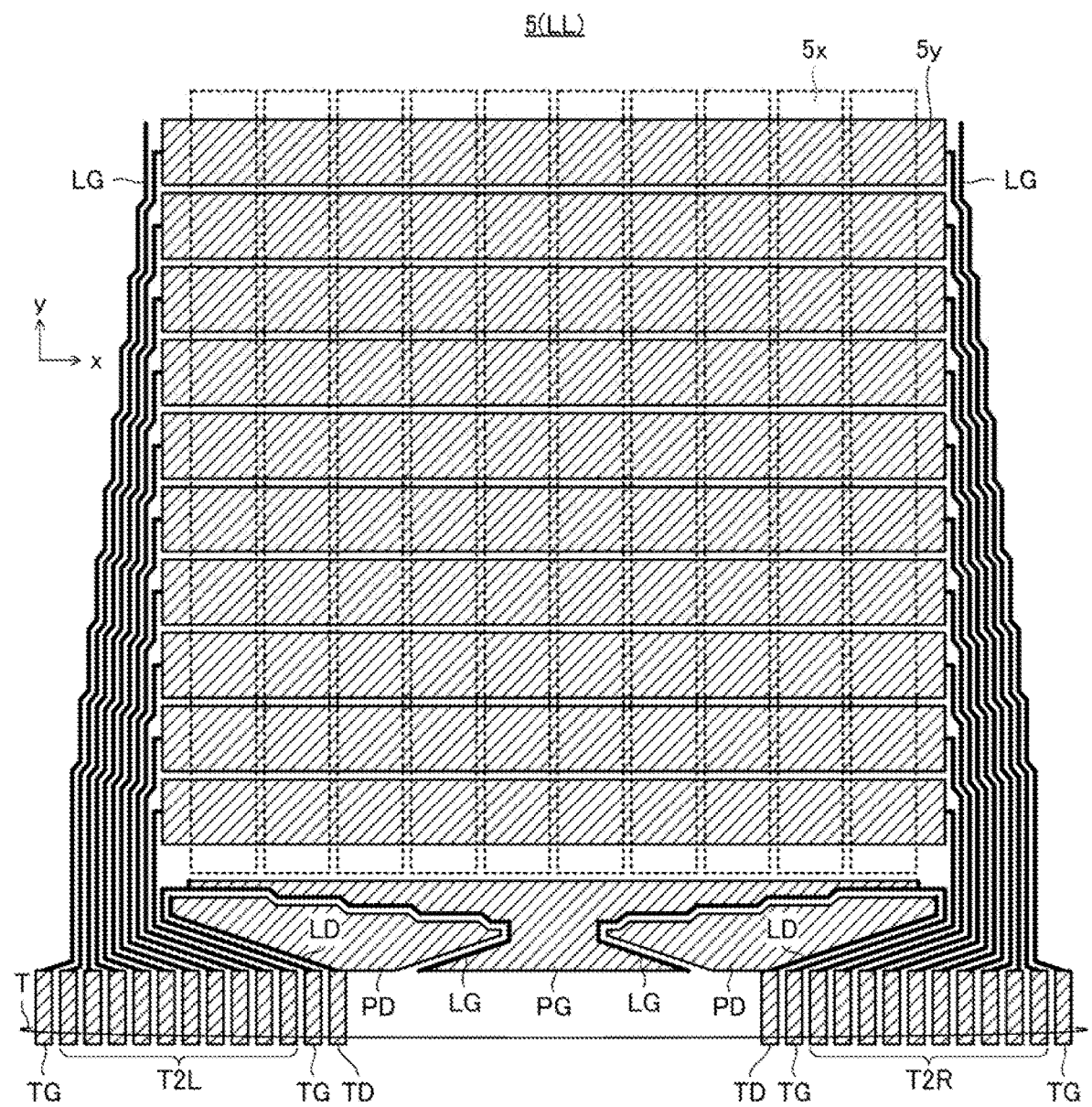
FIG. 16 is a view illustrating only some other elements of the touch sensor of FIG. 14, which are formed in a lower layer.

FIG. 14 is an enlarged view of a touch sensor 5 according to this embodiment. FIG. 15 is a view illustrating only some elements of the touch sensor 5 according to this embodiment, which are formed in the upper layer UL, and FIG. 16 is a view illustrating only some other elements of the touch sensor 5 according to this embodiment, which are formed in the lower layer LL. An electronic device 1 according to this embodiment is different from the electronic device 1 according to the first embodiment in that the linear electrodes 5y are each connected to both of the corresponding routing trace L2L and the routing trace L2R. Otherwise the electronic device 1 according to this embodiment is similar to the electronic device 1 according to the first embodiment. Thus, the same elements as in the first embodiment will be identified by the same references and a description will be made mainly on the differences from the first embodiment.

The linear electrodes 5y are each connected to both of the corresponding routing trace L2L and routing trace L2R, so that in this embodiment, the routing traces L2L and the routing traces L2R are both increased in number and are equal in number to the linear electrodes 5y. As a consequence, FPC connector terminals T2L and FPC connector terminals T2R are also both increased in number than those in the first embodiment.

In this embodiment also, the region A1 and the region A2L are separated by a distance greater than the width R of the reachable range of the pen signal on the touch sensor 5 (D1L>R). This relationship also applies similarly to the region A1 and region A2R (D1R>R). It is, therefore, also possible in this embodiment to prevent that a pen signal is received at both of the FPC connector terminals T1 and the FPC connector terminals T2L or T2R and as a consequence that an unintended line is drawn on a screen.

In this embodiment, the routing traces L1, routing traces L2L, and routing traces L2R are each also arranged to extend over a width smaller than the corresponding group of FPC connector terminals T, and at equal intervals in the region overlapping the bezel area 3b in a plan view. Specifically, the routing traces L1 have portions arrayed across a width D3x (<D2x) smaller than the width D2x of their connection counterparts, i.e., the FPC connector terminals T1 in the array direction (the x-direction), the routing traces L2L have portions arrayed across a width D3yL (<D2yL) smaller than the width D2yL of their connection counterparts, i.e., the FPC connector terminals T2L in the array direction (the x-direction), and the routing traces L2R have portions arrayed across a width D3yR (<D2yR) smaller than the width D2yR of their connection counterparts, i.e., the FPC connector terminals T2R in the array direction (the x-direction). Thus, in this embodiment also, it is possible to reduce, to a minimum extent, a difference in the amounts of noise received at the routing traces and hence to improve the accuracy of position detection which uses the differential method.

In this embodiment, the ground lines LG, the FPC connector terminals TG, the ground patterns PG, the detection lines LD, the FPC connector terminals TD and the detection patterns PD are arranged similarly to the first embodiment, except for minor changes applied to the shapes and positions of some of the routing traces L2L and L2R in association with the increases in their numbers. Therefore, in this embodiment also, it is possible to prevent reporting of a detected position, which does not correctly reflect the position of the stylus 10, to the host controller 2. It is, accordingly, possible to prevent an unintended line from being drawn on the screen.

In the foregoing, the description is made of the embodiments of the present disclosure. However, the present disclosure is by no means limited to these embodiments, and the present disclosure can obviously be practiced in various modes within a range not departing from the spirit of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensor for detecting a pen signal transmitted from a pen, comprising:
    a touch sensor having first electrodes extending in a first direction and second electrodes extending in a second direction perpendicular to the first direction, which form a rectangular-shape position detection area and are configured to respectively receive the pen signal;
    first flexible printed circuit (FPC) connector terminals that are arranged in a first region outside an edge of the position detection area, the edge extending in the second direction, and that are connected to the first electrodes, respectively; and
    second flexible printed circuit (FPC) connector terminals that are arranged in a second region outside said edge of the position detection area and that are connected to at least some of the second electrodes, respectively wherein,
    the first region and the second region are outside the same edge extending in the second direction, and the first FPC connector terminals and the second FPC connector terminals extend in the first direction, and
    the first region and the second region are separated from each other by a distance in the second direction, the distance being greater than a width R which is a spanning distance across a reachable range of the pen signal on the touch sensor, wherein the reachable range of the pen signal is an area on the touch sensor capable of receiving the pen signal at a given time.

2. The sensor according to claim 1, further comprising:
    third flexible printed circuit (FPC) connector terminals that are arranged in a third region outside the position detection area and that are connected to at least some of the second electrodes, respectively, wherein,
    the third region is disposed opposite from the second region in the second direction, with the first region interposed between the second region and the third region in the second direction, and
    the first region and the third region are separated from each other by a distance in the second direction greater than the spanning distance across the width R of the pen signal on the touch sensor.

3. The sensor according to claim 2, wherein the second flexible printed circuit (FPC) connector terminals and the third flexible printed circuit (FPC) connector terminals are connected to all of the second electrodes, respectively.

4. The sensor according to claim 3, wherein
    the sensor is for use in an electronic device provided with a display panel that has a display area and a bezel area, and
    the position detection area is superimposed over the display panel.

5. The sensor according to claim 4, wherein said flexible printed circuit (FPC) connector terminals are arranged at positions that overlap with the bezel area in a plan view.

6. The sensor according to claim 3, further comprising:
    an integrated circuit configured to detect a position of the pen based on the pen signal supplied from the touch sensor via said flexible printed circuit (FPC) connector terminals.

7. The sensor according to claim 2, wherein
    the sensor is for use in an electronic device provided with a display panel that has a display area and a bezel area, and
    the position detection area is superimposed over the display panel.

8. The sensor according to claim 7, wherein said flexible printed circuit (FPC) connector terminals are arranged at positions that overlap with the bezel area in a plan view.

9. The sensor according to claim 2, further comprising:
    an integrated circuit configured to detect a position of the pen based on the pen signal supplied from the touch sensor via said flexible printed circuit (FPC) connector terminals.

10. The sensor according to claim 1, wherein
    the sensor is for use in an electronic device provided with a display panel that has a display area and a bezel area, and
    the position detection area is superimposed over the display panel.

11. The sensor according to claim 10, wherein said flexible printed circuit (FPC) connector terminals are arranged at positions that overlap with the bezel area in a plan view.

12. The sensor according to claim 11, further comprising:
    an integrated circuit configured to detect a position of the pen based on the pen signal supplied from the touch sensor via said flexible printed circuit (FPC) connector terminals.

13. The sensor according to claim 10, further comprising:
    an integrated circuit configured to detect a position of the pen based on the pen signal supplied from the touch sensor via said flexible printed circuit (FPC) connector terminals.

14. The sensor according to claim 1, further comprising:
    an integrated circuit configured to detect a position of the pen based on the pen signal supplied from the touch sensor via said flexible printed circuit (FPC) connector terminals.

* * * * *